United States Patent [19]

Eimori

[11] Patent Number: 5,245,208
[45] Date of Patent: Sep. 14, 1993

[54] SEMICONDUCTOR DEVICE AND MANUFACTURING METHOD THEREOF

[75] Inventor: Takahisa Eimori, Hyogo, Japan

[73] Assignee: Mitsubishi Denki Kabushiki Kaisha, Tokyo, Japan

[21] Appl. No.: 867,741

[22] Filed: Apr. 13, 1992

[30] Foreign Application Priority Data

Apr. 22, 1991 [JP] Japan .................................. 3-090834

[51] Int. Cl.⁵ ............................................ H01L 29/78
[52] U.S. Cl. .................................... 257/344; 257/408; 257/616; 257/607
[58] Field of Search ............... 357/23.4; 257/344, 408, 257/616, 607, 900

[56] References Cited

U.S. PATENT DOCUMENTS

| 4,835,112 | 5/1989 | Pfiester et al. | 257/607 |
| 5,134,447 | 7/1992 | Ng et al. | 357/23.4 |

OTHER PUBLICATIONS

"Design and Characteristics of the Lightly Doped Drain-Source (LDD) Insulated Gate Field-Effect Transistor", by Seiki Ogura, et al, IEEE Transactions on Electron Devices, vol. ED-27, No. 8, Aug. 1980, pp. 1359-1367.

"Submicron MLDD NMOSFETS for 5V Operation", by Masaaki Kinugawa et al, VLSI Symposium (1985), pp. 116-117.

"Optimum Design of Gate/N-Overlapped LDD Transistor", by M. Inuishi et al, VLSI Symposium (1989), pp. 33-34.

"Improved MOSFET Short-Channel Device Using Geranium Implantation", by James R. Pfiester et al, IEEE Electron Device Letters, vol. 9, No 7, Jul. 1988, pp. 343-346.

"Suppression of Hot-Carrier Degradation in Si MOSFET's by Germanium Doping", by Kwok K. Ng et al, IEEE Electron Device Letters, vol 11, No. 1, Jan. 1990, pp. 45-47.

Primary Examiner—Andrew J. James
Assistant Examiner—Stephen P. Meier
Attorney, Agent, or Firm—Lowe, Price, LeBlanc & Becker

[57] ABSTRACT

A semiconductor device includes a first neutral impurity layer formed to a predetermined depth from a surface of a semiconductor substrate in a channel region that is interposed between source/drain regions and located below a gate electrode, and a second neutral impurity layer having a higher concentration than that of the first neutral impurity layer and formed to surround lower portions of the source/drain regions except for the channel region. Scattering of neutral impurities in the first neutral impurity layer suppresses generation of hot carriers, and the second neutral impurity layer suppresses diffusion of impurities in the source/drain regions in thermal processing. The second neutral impurity layer is formed by implanting neutral impurities obliquely after formation of the gate electrode.

5 Claims, 13 Drawing Sheets

SEMICONDUCTOR DEVICE AND MANUFACTURING METHOD THEREOF

BACKGROUND OF THE INVENTION

1. Field of the Invention

The present invention relates generally to a semiconductor device including a MOS (Metal Oxide Semiconductor) transistor and a method of manufacturing such a semiconductor device and, more particularly to technology for achieving higher performance and higher reliability of the MOS transistor by including a neutral impurity layer within a semiconductor substrate.

2. Description of the Background Art

As a highly reliable MOS field effect transistor, such an LDD (Lightly Doped Drain) structure as shown in FIG. 1 and described in, for example, "IEEE Transactions on Electron Devices", ED-27 (1980), p. 1359 has conventionally been employed in general. Referring to FIG. 1, in this MOS field effect transistor, a gate electrode 4 is patterned on a surface of a p well region 2 in a semiconductor substrate 1, with a gate insulator film 3 interposed therebetween. Sidewall spacers 5 and 5 are formed on opposite sidewalls of gate electrode 4. n type impurity layers 6 and 6 of low concentration are formed in the surface of p well region 2 beneath sidewall spacers 5 and 5. n type impurity layers 7 and 7 of high concentration are formed in external regions of n type impurity layers 6 and 6 relative to a portion below gate electrode 4. The structure shown in FIG. 1 has a specific disadvantage of the LDD structure that a mode in which current drivability is degraded, i.e., an increase in parasitic resistance takes place. The increase in parasitic resistance is due to high resistance of n type impurity layers 6 and 6 of low concentration and an effect that electrons are captured in sidewall spacers 5 and 5 located on n type impurity layers 6 and 6. The latter mechanism in particular is that if electrons are captured in both sidewall spacers 5 and 5 on n type impurity layers 6 and 6, electrons in n type impurity layers 6 and 6 adjacent to sidewall spacers 5 and 5 are expelled by repulsive force, whereby a resistance value of n type impurity layers 6 and 6 effectively increases, causing a degradation in current level.

An improvement of such structure is an MLDD (Moderately Lightly Doped Drain) structure shown in, for example, "VLSI SYMPOSIUM (1985)", p. 116. This structure aims to inhibit the above-described degradation mode by setting the concentration of n type impurity layers 6 and 6 to be slightly higher than the concentration of n type impurities, at which a substrate current adopted in the conventional LDD structure becomes minimum, thereby shifting a maximal electric field position further closer to gate electrode 4 and reducing electrons to be injected and captured in sidewall spacers 5 and 5.

As a MOS field effect transistor for inhibiting the degradation mode more effectively, the one employing a gate overlap type LDD structure is described in, for example, "VLSI SYMPOSIUM (1989)", p. 33. In this structure, referring to FIG. 2, with n type impurity layers 6 and 6 of low concentration overlapped with gate electrode 4, the position of a maximum electric field at which hot carriers are generated is shifted directly below gate electrode 4, thereby decreasing the maximum electric field and also preventing electrons from being captured in sidewall spacers 5 and 5.

In the MOS field effect transistor, if neutral impurities such as silicon (Si) or germanium (Ge) are implanted before formation of an impurity layer in source/drain regions, to form a neutral impurity layer 8 as shown in FIG. 3, longitudinal or lateral diffusion of n type impurities in the source/drain regions is inhibited, thereby inhibiting a degradation in characteristics due to a short channel effect. This is described in, for example, "IEEE Electron Device Letters", VOL. 9, No. 7, 1988, p. 343. This document presents a graph shown in FIGS. 4A and 4B as data indicating an effect of Ge doping. FIG. 4A shows impurity profile in a direction of the depth of the semiconductor substrate subjected to annealing at 900° C. in 12 minutes, with respect to the case of only phosphorus doping (implantation energy of 45 KeV, dose of $2.5 \times 10^{15}/cm^2$) and the case with Ge doping (implantation energy of 125 KeV; dose of $5.0 \times 10^{15}/cm^2$) added to the same phosphorus doping. FIG. 4B shows dependence of a threshold voltage shift ($\Delta V_{th}$) on effective channel length with respect to the above -respective cases.

In addition, the fact that a transistor having a channel region or part of the region implanted with neutral impurities such as Ge is particularly effective for inhibition of hot carriers is described in, for example "IEEE Electron Device Letters", VOL. 11, No. 1, 1990, p. 45.

A conventional LDD structure has an advantage that since n type impurity layers 6 and 6 of low concentration are formed of phosphorus being impurities of a large diffusion coefficient, a moderate concentration gradient and a greater effect of reducing an electric field are achieved, whereas it has a disadvantage that a short channel effect is more prominent in a small transistor. That is, such a phenomenon occurs that the threshold voltage ($V_{th}$) of the transistor rapidly falls as the channel length (L) of the transistor becomes smaller. When the channel length (L) used in practice is in a region where the falling of threshold voltage $V_{th}$ takes place, as threshold voltage $V_{th}$ falls more rapidly, the manufacture of the channel length becomes less uniform, thereby causing a greater variation in transistor characteristics and a greater decrease in yield of performance. Thus, if the amount of implantation of phosphorus is reduced in order to suppress the short channel effect, this results in an increase in resistance (parasitic resistance) of n type impurity layers 6 and 6 of low concentration and thus a degradation in current drivability.

In the above-described gate overlap type LDD structure also, the concentration of the n type impurity layers of low concentration formed of phosphorus is not allowed to be considerably high in order to suppress the short channel effect. Thus, such an attempt is considered that n type impurity layers of low concentration is formed of arsenic having a smaller diffusion coefficient, thereby allowing a greater improvement in the falling of threshold voltage $V_{th}$ and a greater decrease in parasitic capacitance as compared to the case with phosphorus. However, arsenic with a small diffusion coefficient cannot achieve a sufficient concentration gradient or a sufficient effect of reducing an electric field, resulting in a difficulty of sufficiently reducing a substrate current due to hot carriers.

Further, in any conventional LDD structures, the rate of hot carrier generation is suppressed by the reduced electric field effect; however, phonon scattering, i.e., scattering of electrons in crystal caused by lattice vibration decreases at lower temperatures, and the hot carrier generation rate increases again. Thus, there is a disadvantage that hot carrier characteristics are still deteriorated.

Although the transistor having the channel region or part of the region implanted with neutral impurities such as Ge is effective for the inhibition of hot carriers, such an effect is approximately half or one third of the effect of the LDD structure, and there is a limitation in reducing the hot carrier effect of a transistor of a submicron level only by neutral impurities such as Ge.

The amount of Ge implantation for suppressing such a short channel effect requires approximately $10^{19}$–$10^{20}$/cm$^3$, however, the implantation of such high concentration neutral impurities into the channel region causes defects or stresses in the channel region, thereby greatly affecting transistor characteristics. More specifically, since there is a difference between an optimal implantation amount for suppressing the longitudinal or lateral diffusion of n type impurities in the source/drain regions to suppress the short channel effect and an optimal implantation amount into the channel region for suppressing hot carriers, both optimum conditions cannot be satisfied by a single implantation.

SUMMARY OF THE INVENTION

An object of the present invention is to provide a smaller LDD transistor having higher performance and higher reliability implemented by balancing a decrease in short channel effect and a decrease in hot carrier effect and to provide a smaller semiconductor device that achieves a decrease in hot carrier effect while sufficiently maintaining its current handling capability even at low temperatures.

A semiconductor device of the present invention accomplishing the foregoing object includes a MOS field effect transistor including a semiconductor substrate having a first conductivity type region formed to at least a predetermined depth from at least a surface thereof, a gate insulator film formed in the surface of the semiconductor substrate, a gate electrode formed on a surface of the gate insulator film, and source/drain regions formed of a second conductivity type impurity layer, formed to extend outward from the vicinity of a portion directly beneath opposite sidewalls of the gate electrode. The semiconductor device is characterized in that the semiconductor device includes a first neutral impurity layer formed by implanting neutral impurities of predetermined concentration to a predetermined depth from the surface of the semiconductor substrate, in a channel region located beneath the gate electrode interposed between the source/drain regions, and a second neutral impurity layer having a higher concentration than that of the first neutral impurity layer and formed by implanting neutral impurities to surround the source/drain regions except for the channel region.

According to the structure of the semiconductor device, surrounding the source/drain regions with the second neutral impurity layer makes it possible to suppress diffusion of the second conductivity type impurity layer and a decrease in threshold voltage with a decrease in channel length. This is because monocrystalline silicon or the like constituting the semiconductor substrate is made amorphous by neutral impurities implanted at a sufficiently high concentration, whereby channeling in implanting the second conductivity type impurities or diffusion in heat treatment is suppressed.

If the diffusion of impurities included in the second conductivity type impurity-layer of low concentration is suppressed, then concentration gradient becomes sharper for the LDD structure, resulting in a slight decrease in an effect of reducing an electric field. The first neutral impurity layer serves to reinforce the decrease in an effect of suppressing the hot carriers with a separate effect from the electric field reducing effect. More specifically, the generation of the hot carriers is inhibited by such an effect that scattering of the neutral impurities which are additionally introduced into the channel region deprives the hot carriers of energy and prevents inclinations in angle at which hot carriers drawn to an oxide film are scattered. The scattering of neutral impurities of Ge in particular occurs at a high probability with respect to hot carriers in a relatively long mean free path as compared to a mean free path of the majority of channel carriers. Accordingly, the neutral impurities themselves hardly decrease the current drivability.

Further, the concentration of the first neutral impurity layer is set to a suitable concentration lower than that of the second neutral impurity layer so as not to cause any stresses in its region or greatly affect transistor characteristics.

In addition, there is no temperature dependence in general in the scattering by neutral impurities. Even if average energy of channel carriers is increased by suppressing phonon scattering after a low-temperature operation, the scattering by neutral impurities still acts effectively to suppress generation of hot carriers.

In order to effectively cause the above effect, the first neutral impurity layer and the second neutral impurity layer are preferably implanted with Ge of $10^{19}$–$10^{20}$/cm$^3$ in concentration and Ge of $10^{16}$–$10^{19}$/cm$^3$ in concentration, respectively.

The first neutral impurity layer of the semiconductor device thus structured is formed on the overall surface of the semiconductor substrate by applying neutral impurities to a predetermined depth from its surface before formation of the gate insulator film or the gate electrode. After the gate electrode is then patterned, the second neutral impurity layer is formed by applying neutral impurities from a direction with a predetermined inclination relative to the surface of the semiconductor substrate, with the gate electrode used as a mask.

In such a manufacturing method, the reason why the first neutral impurity layer is first formed on the semiconductor substrate surface by applying the neutral impurities prior to the formation of the gate insulator film or the gate electrode is that the gate insulator film is damaged by implanting the neutral impurities into the channel region after the formation of the gate insulator film.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 5:
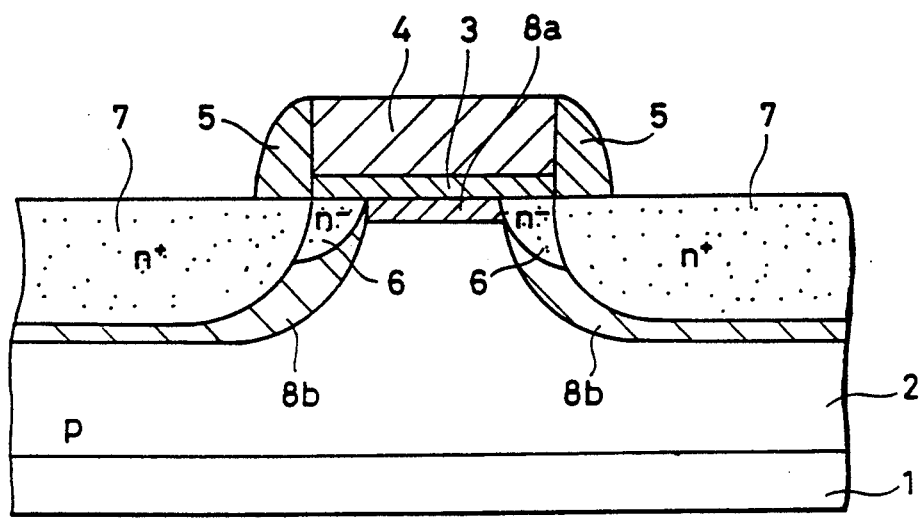
FIG. 5 is a sectional view showing a cross-sectional structure of a gate overlap type LDD transistors according to a first embodiment of the present invention.

Description will now be made on a semiconductor device of a first embodiment of the present invention with reference to FIG. 5. The semiconductor device shown in FIG. 5 is made by applying the present invention to an nMOS field effect transistor having a gate overlap type LDD structure. Referring to FIG. 5, a gate electrode 4 is patterned on a surface of a p well 2 formed in a semiconductor substrate 1 made of monocrystalline silicon or the like, with a gate insulator film 3 interposed between the p well surface and the gate electrode. n type impurity layers 6 and 6 of low concentration are formed to a predetermined depth from the surface of p well 2 to overlap with gate electrode 4 by implanting phosphorus ions. n type impurity layers 7 and 7 of high concentration implanted with arsenic ions or the like are formed to be adjacent to n type impurity layers 6 and 6 and extend outward from portions directly beneath opposite sidewalls of gate electrode 4. Sidewall spacers 5 and 5 serving as masks in implanting arsenic or the like of n type impurity layers 7 and 7 are formed on the opposite sidewalls of gate electrode 4. Further, n type impurity layers 6 and 6 of low concentration and n type impurity layers 7 and 7 of high concentration are surrounded by a second neutral impurity layer 8b doped with germanium of $10^{19}$–$10^{20}$/cm$^3$ except for a channel region directly beneath the center of gate electrode 4. A first neutral impurity layer 8a doped with germanium of $10^{16}$–$10^{19}$/cm$^3$ is formed to a depth of approximately 0.1 μm from the surface of p well 2, in the channel region interposed between n type impurity layers 6 and 6 of low concentration.

Figure 2:
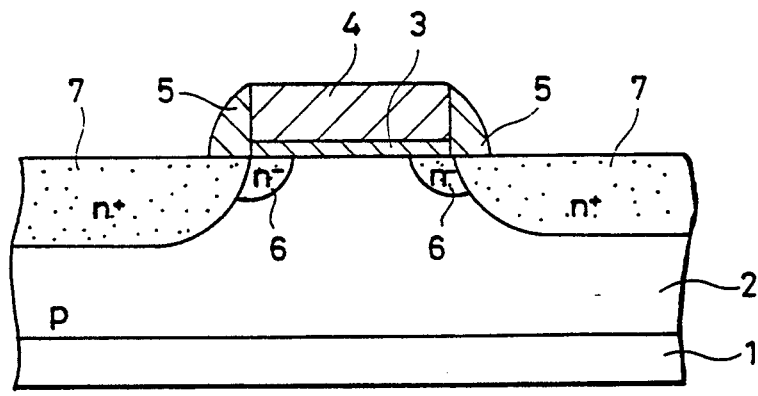
FIG. 2 is a sectional view showing a cross-sectional structure of a conventional MOS field effect transistor having a gate overlap type LDD structure.
Figure 3:
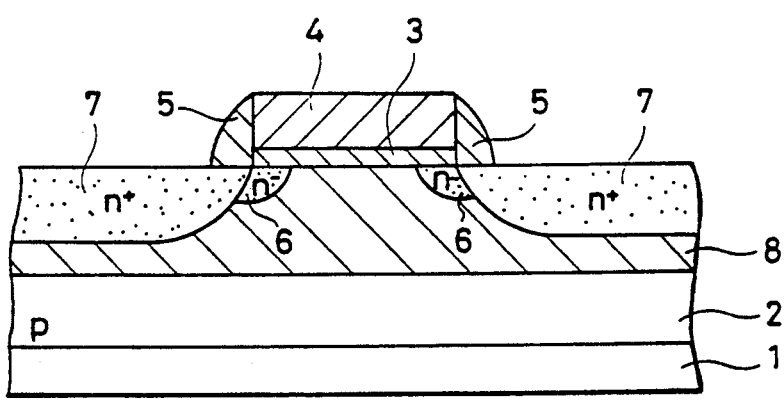
FIG. 3 is a sectional view showing a cross-sectional structure of the conventional MOS field effect transistor of the gate overlap type LDD structure, in which the characteristics of a channel effect is achieved by implantation of neutral impurities such as Si or Ge.
Figure 4A:
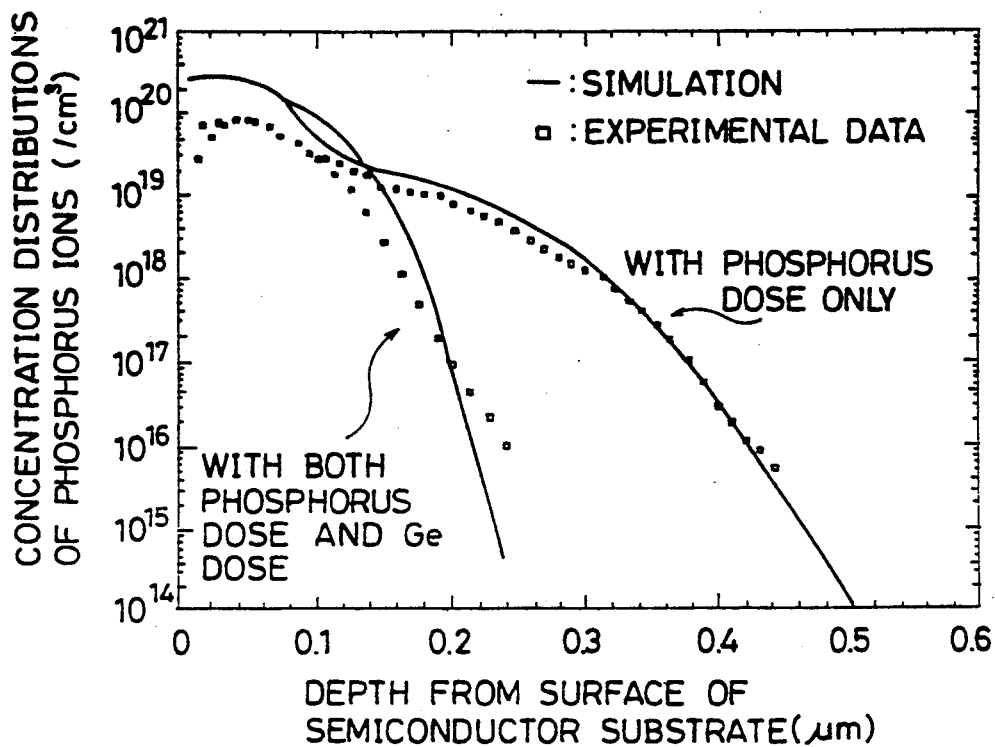
FIG. 4A is a diagram showing simulation results and experiment data of impurity diffusion in depth from a substrate surface, of the conventional gate overlap type LDD transistor shown in FIGS. 2 and 3.
Figure 4B:
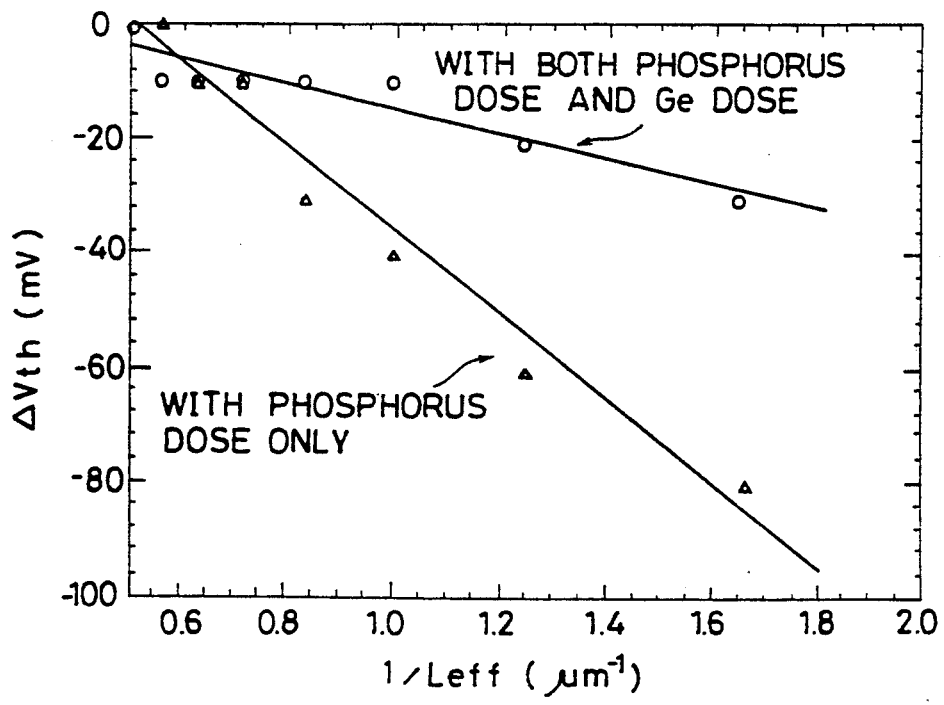
FIG. 4B is a diagram showing dependence of threshold voltage shift on an effective channel length of the two conventional gate overlap type LDD transistors shown in FIGS. 2 and 3.
Figure 14:
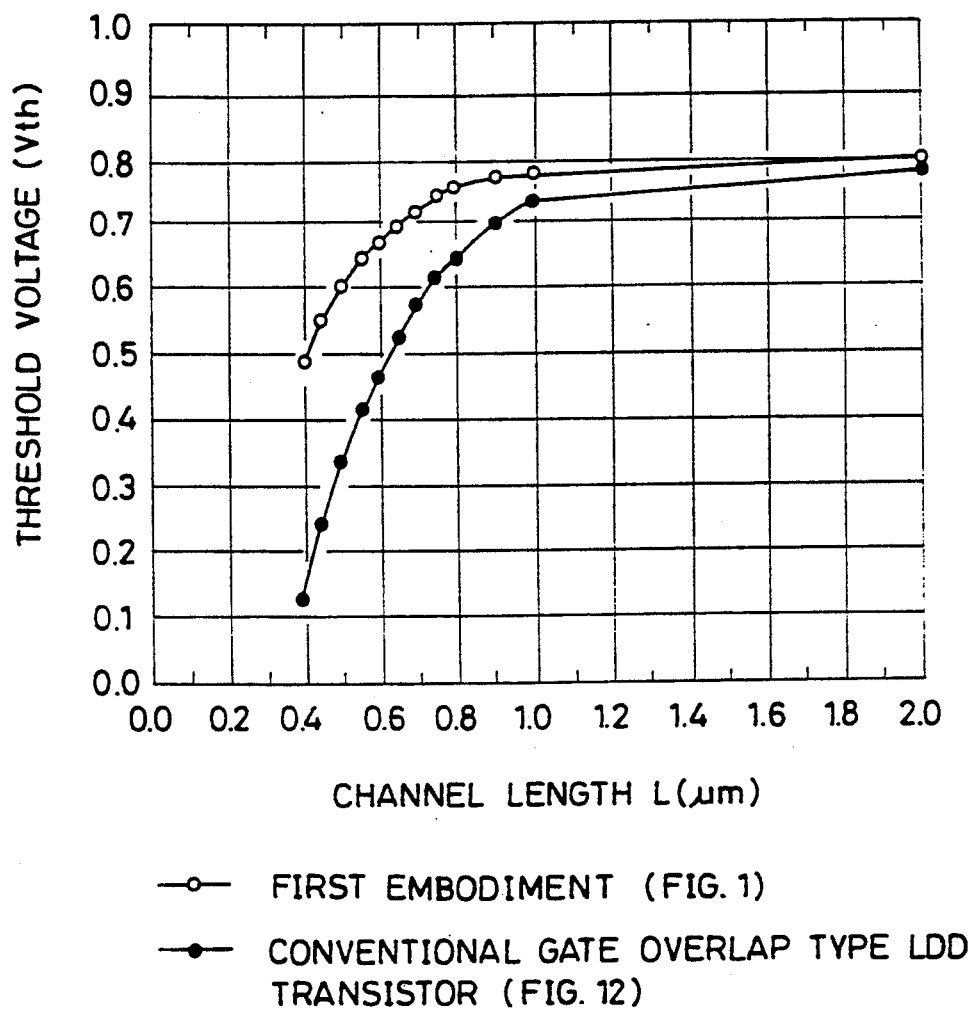
FIG. 14 is a diagram showing in graph the relationship between threshold voltages and channel lengths of the conventional gate overlap type LDD transistor and the gate overlap type LDD transistor according to the first embodiment of the present invention.

In the semiconductor device including the MOS transistor of the first embodiment, n type impurity layers 6 and 6 and n type impurity layers 7 and 7 are surrounded by second neutral impurity layer 8b, with n type impurity layers 6 and 6 of the LDD structure maintained at low concentration. Thus, a short channel effect such as an abrupt deterioration in threshold voltage of the transistor can be inhibited by an effect of suppressing the channeling and diffusion of phosphorus ions due to a high concentration neutral element, with parasitic resistance of the n type impurity layers of low concentration being suppressed to a lower value so as to securely maintain current handling capability. The graph shown in FIG. 14 represents the effect of the present invention by comparing dependence of threshold voltages on channel lengths between the transistor of the embodiment shown in FIG. 5 and the conventional gate overlap type LDD transistor shown in FIG. 2.

For the LDD structure, the effect that the diffusion of impurity concentration of n type impurity layers 6 and 6 of low concentration acts in a direction of abruptly changing a concentration gradient, thereby slightly reducing an effect of reducing an electric field. First neutral impurity layer 8a, which is additionally formed in the channel region where hot carriers are generated by implanting Ge at a lower concentration than that of second neutral impurity layer 8b, serves to make up the decrease in the effect of suppressing hot carriers with a separate effect from the electric field reducing effect. More specifically, the generation of hot carriers is inhibited and the reliability enhances by an effect of depriving energy from hot carriers and preventing inclinations in angle at which hot carriers drawn to an oxide film are scattered, due to scattering of neutral impurities that are additionally introduced into the channel region by Ge element. The scattering of neutral impurities by the Ge element occurs at a high probability for hot carriers in a relatively long mean free path as compared to a mean free path of the majority of channel carriers. Therefore, the Ge element itself hardly decreases current handling capability. The Ge concentration of first neutral impurity layer 8a is made lower than that of second neutral impurity layer 8b so as not to greatly change transistor characteristics with no stress generated in the surface of semiconductor substrate 1 in the vicinity of the channel.

The scattering by neutral impurities in general has no temperature dependence. Even if average energy of channel carriers is increased by suppressing phonon scattering under a low-temperature operation, the neutral impurity scattering still effectively acts to suppress the generation of hot carriers.

Description will now be given on a method of manufacturing the semiconductor device of this embodiment with reference to FIGS. 6-11.

Figure 6:
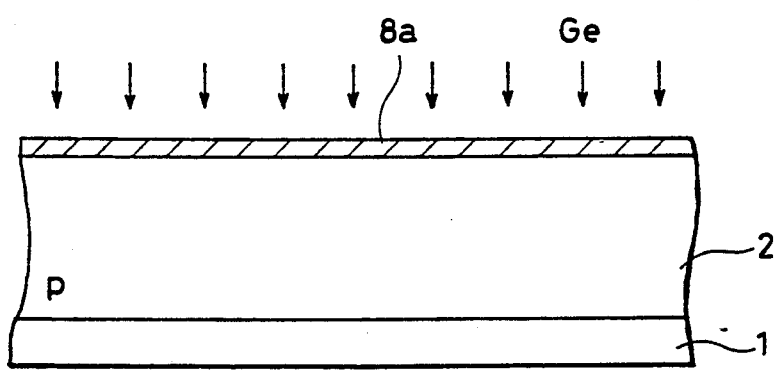
FIG. 6 is a sectional view showing a first step in a method of manufacturing a semiconductor device of the embodiment shown in FIG. 5.

In this embodiment, Ge impurities as neutral impurities are applied onto the overall surface of the p well region in semiconductor substrate 1, whereby neutral impurity layer 8a of $10^{16}$–$10^{19}$/cm$^3$ in concentration is formed to a depth of approximately 0.1 μm from the surface of p well 2 (FIG. 6).

Figure 7:
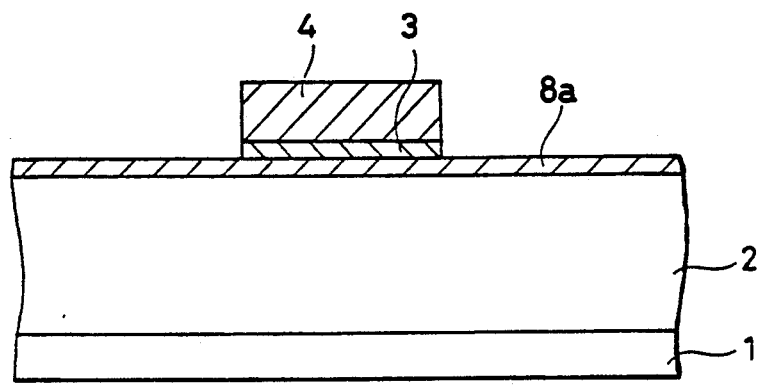
FIG. 7 is a sectional view showing a second step in the method of manufacturing the semiconductor device of the embodiment shown in FIG. 5.

Gate insulator film 3 is then formed by thermal oxidation on the surface of p well 2 having first neutral impurity layer 8a formed therein. A conductor layer formed of a polycrystalline silicon layer of a predetermined thickness is then formed thereon. After that, the resultant layer is patterned by photolithography and etching, thereby forming gate electrode 4 (FIG. 7).

Figure 8:
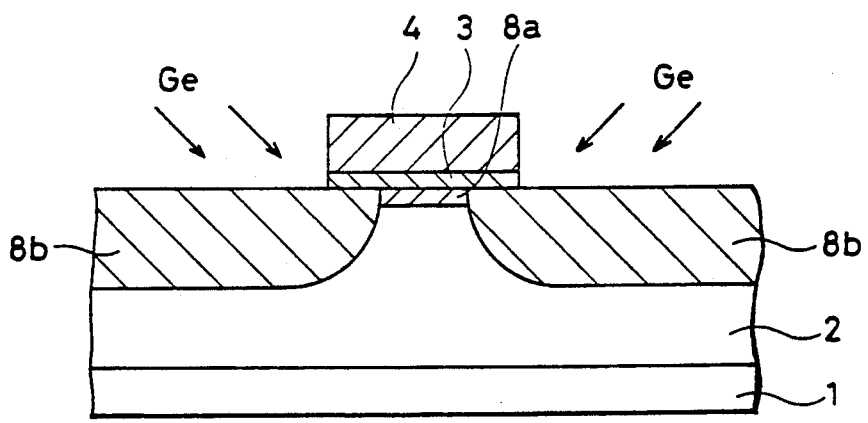
FIG. 8 is a sectional view showing a third step in the method of manufacturing the semiconductor device of the embodiment shown in FIG. 5.

Then, with gate electrode 4 used as a mask, the Ge impurities as neutral impurities are applied to the surface of p well 2 from a direction with an angle of e.g., approximately 45°, with semiconductor substrate 1 being rotated within a plane parallel to the surface of p well 2, thereby forming second neutral impurity layer 8b of $10^{19}$–$10^{20}$/cm$^3$ in concentration to a predetermined depth from the surface of p well 2 (FIG. 8).

Figure 9:
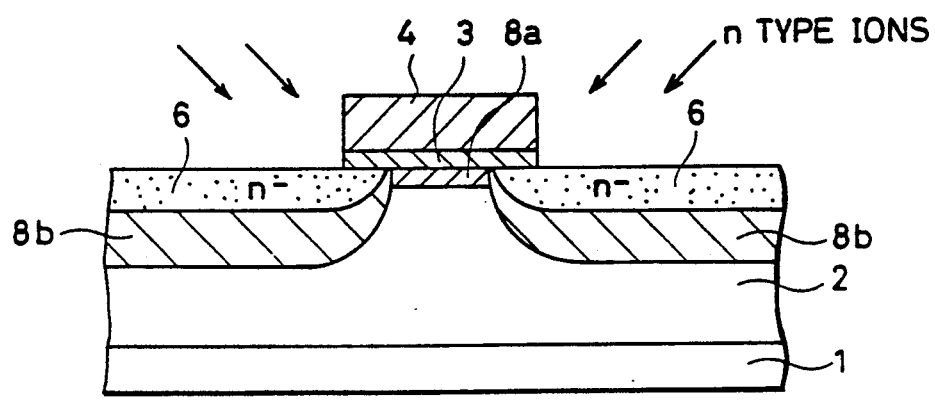
FIG. 9 is a sectional view showing a fourth step in the method of manufacturing the semiconductor device of the embodiment shown in FIG. 5.

Then, with gate electrode 4 used as a mask again, n type impurities such as phosphorus ions are applied to the surface of semiconductor substrate 1 from a direction with a predetermined inclination of e.g., 45°, with semiconductor substrate 1 being rotated within a plane parallel to the surface of semiconductor substrate 1, thereby forming n type impurity layers 6 and 6 of low concentration in an inward region of second neutral impurity layer 8b (FIG. 9).

Figure 10:
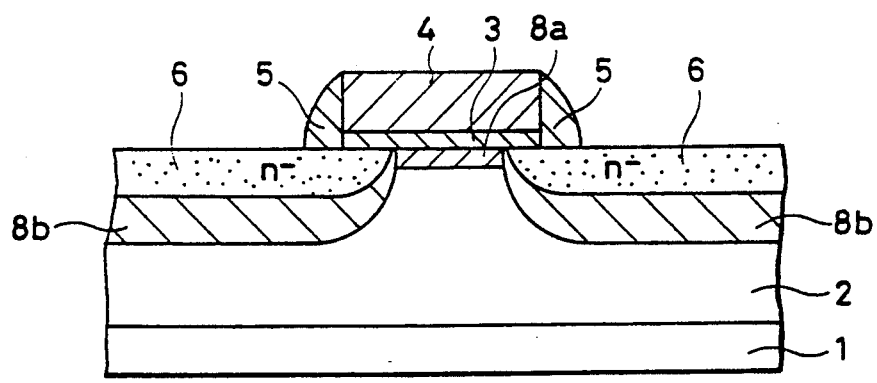
FIG. 10 is a sectional view showing a fifth step in the method of manufacturing the semiconductor device of the embodiment shown in FIG. 5.
Figure 11:
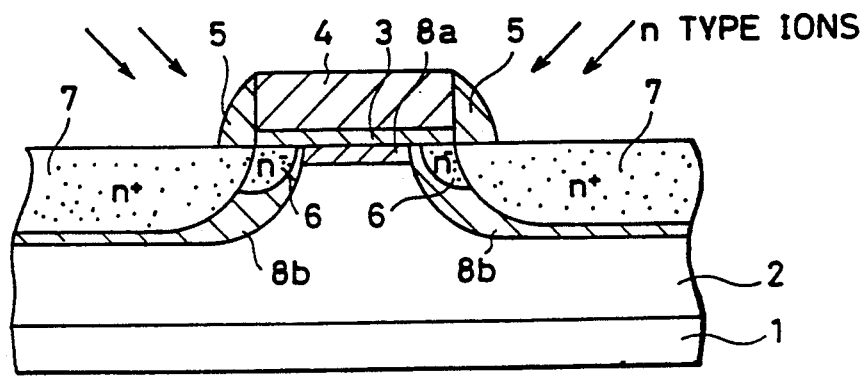
FIG. 11 is a sectional view showing a sixth step in the method of manufacturing the semiconductor device of the embodiment shown in FIG. 5.

Then, sidewall spacers 5 and 5 of a predetermined width are formed on opposite sidewalls of gate electrode 4 by depositing a silicon oxide film to a predetermined thickness on the overall surface of semiconductor substrate 1 by CVD or the like, and then subjecting the deposited film to anisotropical etching (FIG. 10). After that, with sidewall spacers 5 and 5 and gate electrode 4 used as masks, n type impurities such as arsenic ions or the like are implanted from a direction with a predetermined inclination to the surface of semiconductor substrate 1, with semiconductor substrate 1 being rotated within the plane parallel to the surface thereof, thereby forming n type impurity layers 7 and 7 of high concentration inward of the region of second neutral impurity layer 8b (FIG. 11).

The reason why the first neutral impurity layer is first formed by implanting the Ge element onto the surface of p well 2 prior to formation of the gate insulator film or the gate electrode in the manufacturing process of this embodiment is that if the Ge element is implanted after formation of the gate insulator film, the gate insulator film is damaged.

Figure 13:
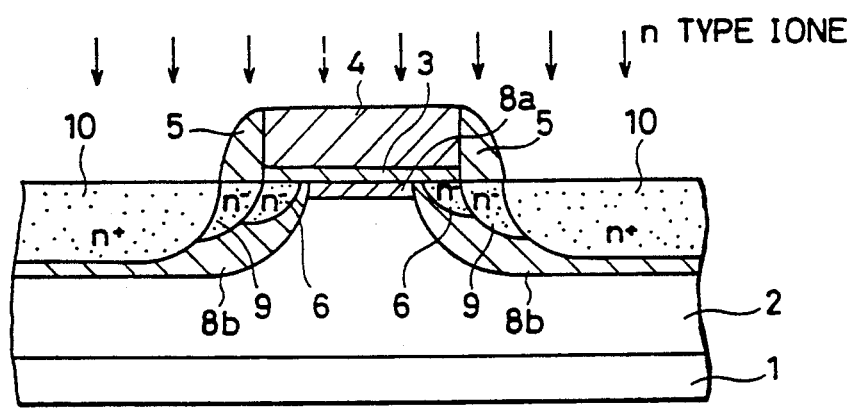
FIG. 13 is a sectional view showing a step of forming an n type impurity layer of high concentration in the method of manufacturing the gate overlap type LDD transistor according to the second embodiment of the present invention.

A second embodiment of the present invention will now be described. In this embodiment, source/drain regions are of a triple LDD structure, as shown in FIG. 13. More specifically, neutral impurity layers 9 and 9 and n type impurity layers 10 and 10 of high concentration adjacent to neutral impurity layers 9 and 9 are formed in n type impurity regions 7 and 7 of high concentration of the foregoing first embodiment. The use of such a triple structure allows an effective suppression of a short channel effect. An effect of an LDD transistor having the triple structure has already been reported in various documents or articles.

Figure 12:
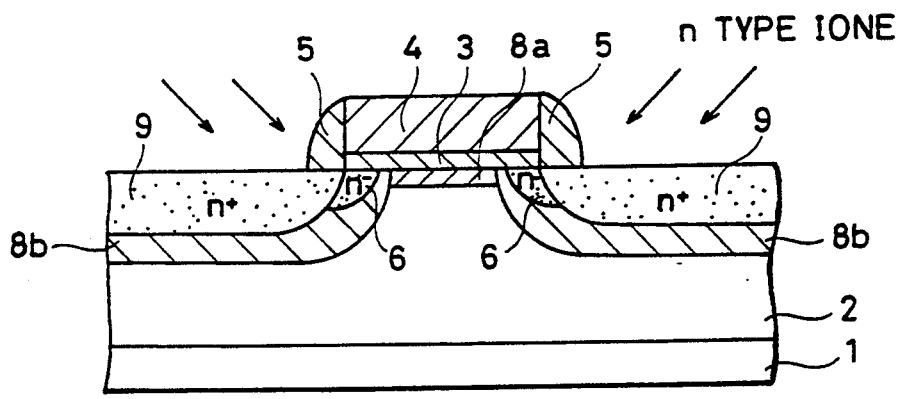
FIG. 12 is s sectional view showing a step of forming an n type impurity layer of moderate concentration in a method of manufacturing a gate overlap type LDD transistor according to a second embodiment of the present invention.

In the method of manufacturing the semiconductor device of the second embodiment shown in FIG. 13, the steps of FIGS. 2 to 6 are common to the corresponding steps in the first embodiment, and only the subsequent step of forming source/drain regions is different from the first embodiment. That is, after sidewall spacers 5 and 5 are formed, n type impurities such as phosphorus ions or arsenic ions are implanted by an oblique rotary ion implantation in smaller dose than that in the step of FIG. 11 in the first embodiment, whereby n type impurity layers 9 and 9 of moderate concentration are formed (FIG. 12).

Then, n type impurities such as arsenic ions are applied perpendicularly to the surface of semiconductor substrate 1 and implanted onto the surface of p well 2 with sidewall spacers 5 and 5 and gate electrode 4 used as masks, thereby forming n type impurity layers 10 and 10 of high concentration and thus perfecting the structure shown in FIG. 13.

While first neutral impurity layer 8a is formed over the entire channel region in any of the foregoing embodiments, the same effect is achieved also by forming first neutral impurity layer 8a in a part of the channel region such as only a region where the electric field in and around drain regions is maximum.

In addition, while semiconductor substrate 1 is rotated within a plane parallel to its surface in implanting impurities from a direction with an inclination of a predetermined angle relative to the surface of semiconductor substrate 1 in the formation of second moderate concentration impurity layers 8b and 8b, low concentration n type impurity layers 6 and 6, or the like, a desired impurity layer can be obtained also by implanting impurities for the same time period from the respective directions obliquely above one sidewall of gate electrode 4 and obliquely above the other sidewall thereof, with semiconductor substrate 1 being kept stationary.

A description will now be made on a semiconductor device according to a third embodiment of the present invention and a method of a manufacturing the semiconductor device with reference to FIGS. 15-20.

Figure 1:
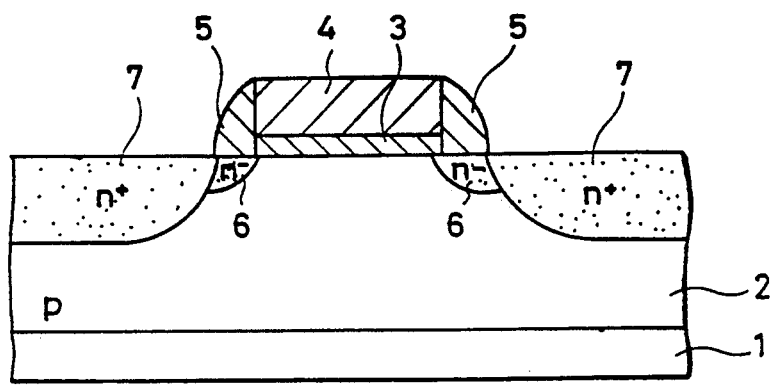
FIG. 1 is a sectional view showing a cross-sectional structure of a conventional MOS field effect transistor having an LDD structure not of gate overlap type.
Figure 15:
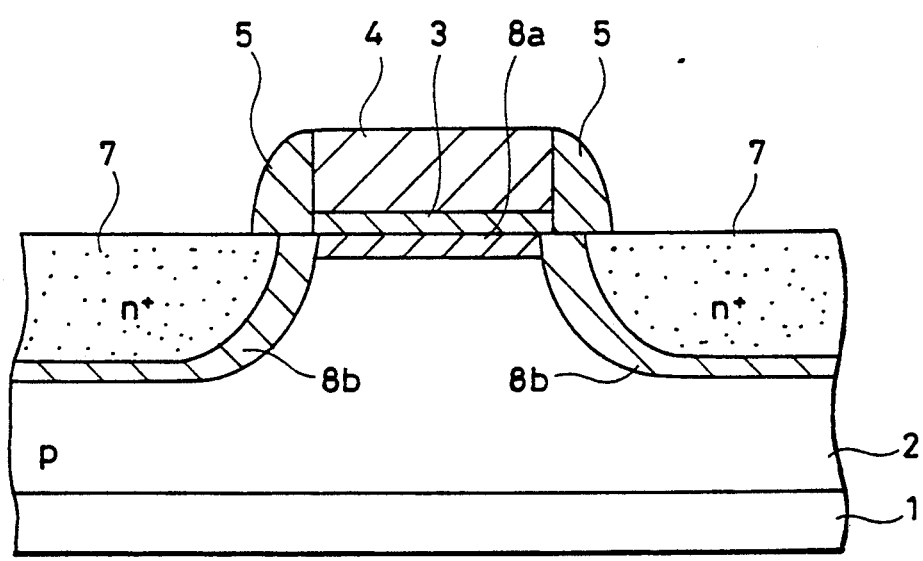
FIG. 15 is a sectional view showing structure of a semiconductor device according to a third embodiment of the present invention.

In this embodiment, the present invention is applied to a transistor of a single source/drain structure. The semiconductor device of this embodiment has approximately the same structure as that of the semiconductor device shown in FIG. 1 except that an n type impurity layer 6 of low concentration does not exist in source/drain regions as shown in FIG. 15. Therefore, a detailed description on that structure will not be repeated here.

In the structure of this embodiment, the semiconductor device does not serve to inhibit generation of hot carriers due to an electric field reducing effect; however, thermal diffusion in n type impurity layers 7 and 7 of high concentration is inhibited and also a short channel effect can be inhibited as compared to a conventional transistor of a single source/drain structure.

Figure 16:
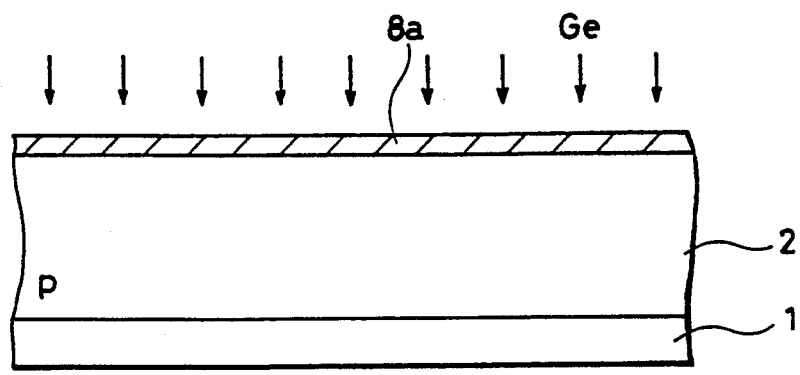
FIG. 16 is a sectional view showing a first step in a method of manufacturing the semiconductor device of the third embodiment of the present invention.
Figure 17:
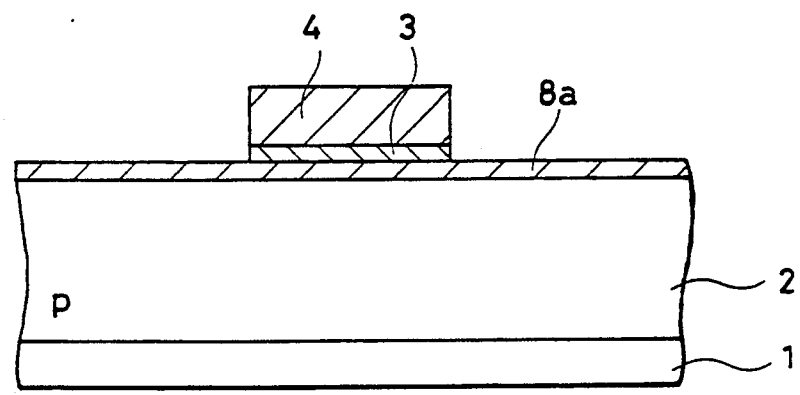
FIG. 17 is a sectional view showing a second step in the manufacturing method according to the third embodiment of the present invention.

The semiconductor device of this embodiment is manufactured by steps shown in, for example, FIGS. 16-20. Referring first to FIG. 16, neutral impurities of Ge are implanted onto the entire surface of a p well region 2 of a semiconductor substrate 1, whereby a first neutral impurity layer 8a having a concentration of $10^{16}$–$10^{19}$/cm$^3$ is formed to a depth of approximately 0.1 μm from the surface of p well 2. Referring then to FIG. 17, a gate insulator film 3 is formed on the surface of p well 2, on which first neutral impurity layer 8a is formed, by employing thermal oxidation. A conductor layer formed such as of a polycrystalline silicon layer of a predetermined thickness is then formed on gate insulator film 3. After that, a resulting layer is patterned by photolithography and etching, thereby forming a gate electrode 4. The foregoing steps are the same as those described in the manufacturing process of the above described first embodiment with reference to FIGS. 2 and 3.

Figure 18:
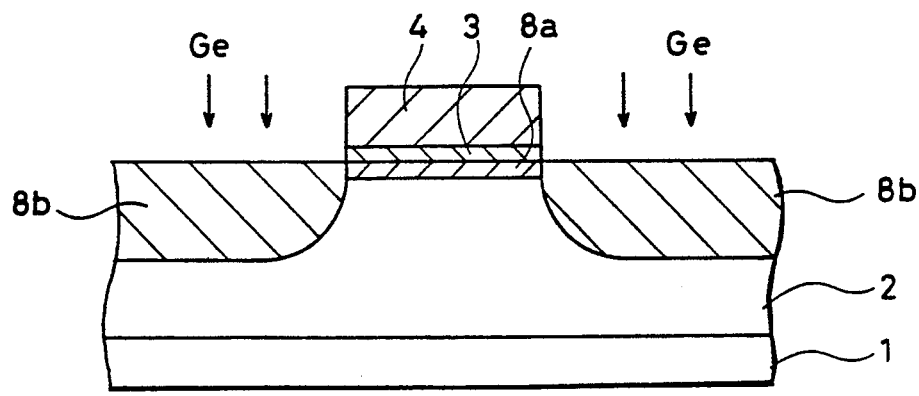
FIG. 18 is a sectional view showing a third step in the manufacturing method according to the third embodiment of the present invention.
Figure 19:
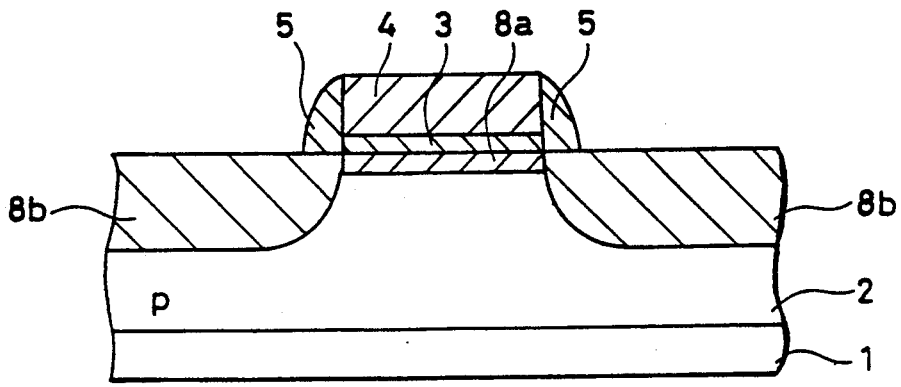
FIG. 19 is a sectional view showing a fourth step in the manufacturing method according to the third embodiment of the present invention.

Then, with reference to FIG. 18, neutral impurities of Ge are implanted vertically to the surface of p well 2, with gate electrode 4 used as a mask, whereby second neutral impurity layers 8a and 8b are formed to a predetermined depth from the surface of p well 2. After that, an insulator film layer of a predetermined thickness is formed on the entire surface of semiconductor substrate 1 including an outer surface of gate electrode 4 and is then subjected to anisotropic etching, whereby sidewall spacers 5 and 5 are formed as shown in FIG. 19.

Figure 20:
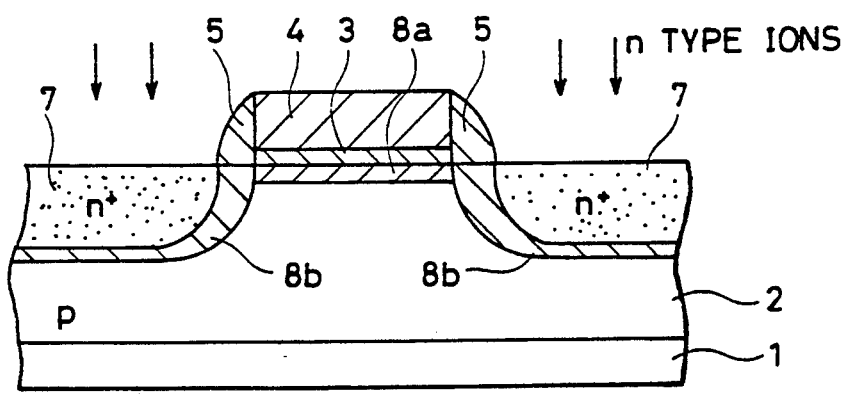
FIG. 20 is a sectional view showing a fifth step in the manufacturing method according to the third embodiment of the present invention.

Then, with reference to FIG. 20, n type impurities of phosphorus are implanted with gate electrode 4 and sidewall spacers 5 and 5 used as masks, whereby n type impurity layers 7 and 7 of high concentration serving as source/drain regions are formed to a depth which is smaller than the depth of second neutral impurity layers 8b and 8b from the surface of p well 2. After that, a resulting layer undergoes a heat treatment for activating impurities, thereby completing a single source/drain transistor of the structure shown in FIG. 15.

According to the manufacturing method of the present embodiment, the transistor of the single source/drain structure to which the present invention is applied can be formed in comparatively simple steps by employing only vertical implantation not oblique implantation.

Figure 21:
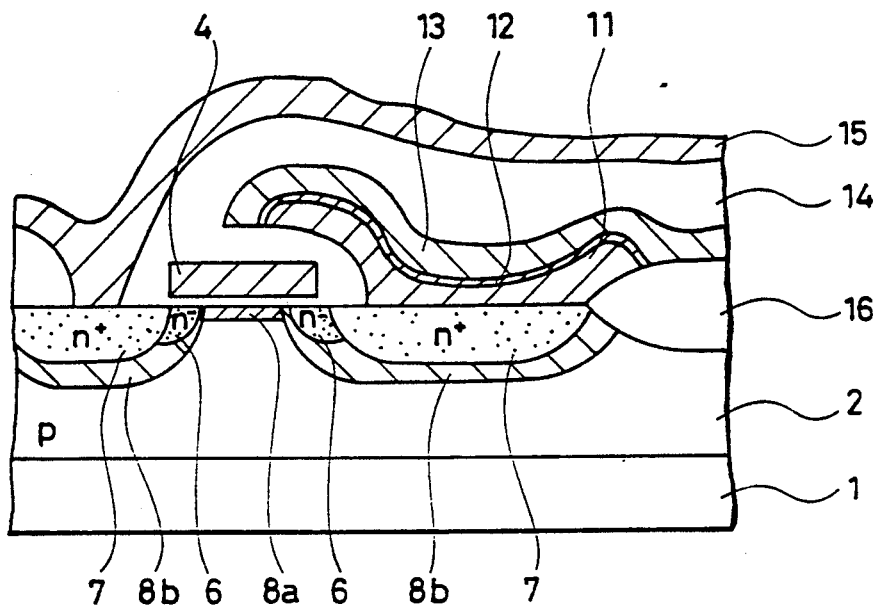
FIG. 21 is a sectional view showing structure of a memory cell of a DRAM to which the first embodiment of the present invention is applied.

A description will now be made on a typical example in which the semiconductor device of the present invention is applied to a device with reference to FIG. 21. FIG. 21 shows a structure in which the present invention is applied to a memory cell of a DRAM (Dynamic Random Access Memory).

This memory cell is formed on an active region which is in the surface of a p well- 2 of a semiconductor substrate 1 and is isolated by a field insulator film 16. The memory cell is principally comprised of an LDD transistor and a capacitor to which the present invention is applied. The LDD transistor includes a gate electrode 4 serving as a word line, n type impurity layers 6 and 6 of low concentration serving as source/drain regions and n type impurity layers 7 and 7 of high concentration. The LDD transistor further includes, like the above-described first embodiment, a first neutral impurity layer 8a and a second impurity layer 8b. A lower electrode 11 of the capacitor is connected on the surface of right-hand n type impurity layer 7 of high concentration, and an upper electrode 13 is formed on lower electrode 11 with a dielectric layer 12 interposed therebetween. An interlayer insulation film 14 is formed on gate electrode 4 and upper electrode 13. A bit line 15 formed of a conductor layer such as of aluminum is formed on the surface of interlayer insulating film 14. This bit line 15 is connected to the surface of left-hand n type impurity layer 7 of high concentration in a contact hole formed in interlayer insulating film 14.

As described above, the application of the LDD transistor according to the present invention to the memory cell of the DRAM makes it possible to prevent hot carriers from entering into a capacitor due to a short channel effect and hence implement a memory cell having good characteristics and no soft errors.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, comprising:
    a semiconductor substrate having a main surface;
    a gate electrode of a predetermined width formed on said main surface with a gate insulator film therebetween;
    source/drain regions including a second conductivity type impurity diffusion layer, formed to extend outward from the vicinity of a portion directly beneath opposite sidewalls of said gate electrode, a channel region located below said gate electrode and interposed between said source/drain regions;
    a first neutral impurity layer formed to a predetermined depth from said main surface of said semiconductor substrate in said channel region and having a first concentration; and
    a second neutral impurity layer having a second concentration, higher than said first concentration, formed by implanting neutral impurities so as to surround a lower surface of said source/drain regions and not a lower surface of said first neutral impurity layer located below said gate electrode.

2. The semiconductor device according to claim 1, wherein said source/drain regions include a pair of second conductivity type impurity layers of low concentration formed to extend to a predetermined position inward from the portion directly beneath the opposite sidewalls of said gate electrode, and a pair of second conductivity type impurity layers of high concentration formed to be adjacent to said low concentration impurity layers and extend outward.

3. The semiconductor device according to claim 1, wherein said second neutral impurity layer surrounding the bottom surface of said source/drain regions comprises germanium of $10^{19}$–$10^{20}$/cm$^3$ in concentration, and said first neutral impurity layer at said channel region comprises germanium of $10^{16}$–$10^{19}$/cm$^3$ in concentration.

4. The semiconductor device according to claim 1, wherein a first conductivity type region of said semiconductor substrate is a p type well region, and said source/drain regions are doped with n type impurities.

5. A semiconductor device, comprising:
    a semiconductor substrate made of monocrystalline silicon and having a p well to a predetermined depth from a surface;

a gate insulator film formed on a main surface of said semiconductor substrate;

a gate insulator of a predetermined width formed on said gate insulator film;

a pair of n type impurity layers of low concentration formed to extend to a predetermined position inward from a portion directly beneath opposite sidewalls of said gate electrode by implanting phosphorus;

n type impurity layers of high concentration formed to be adjacent to said n type impurity layers of low concentration and extend outward by implanting arsenic;

a first neutral impurity layer including germanium of $10^{16}$ to $10^{19}/cm^3$ in concentration and formed to a depth of approximately 0.1 μm from said main surface of said semiconductor substrate, in a channel region that is interposed between said n type impurity layers of low concentration and located below said gate electrode; and a second neutral impurity layer including germanium of $10^{19}$ to $10^{20}/cm^3$ in concentration and formed to surround lower portions of said n type impurity layers and said n type impurity layers except for said channel region.

* * * * *